US009674971B2

(12) United States Patent
Haraguchi

(10) Patent No.: US 9,674,971 B2
(45) Date of Patent: Jun. 6, 2017

(54) TERMINAL DEVICE

(71) Applicant: PANASONIC INTELLECTUAL PROPERTY MANAGEMENT CO., LTD., Osaka (JP)

(72) Inventor: Taku Haraguchi, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/638,187

(22) Filed: Mar. 4, 2015

(65) Prior Publication Data
US 2015/0264819 A1 Sep. 17, 2015

(30) Foreign Application Priority Data

Mar. 11, 2014 (JP) ................................ 2014-047997

(51) Int. Cl.
*G08B 5/22* (2006.01)
*H05K 5/00* (2006.01)

(52) U.S. Cl.
CPC ................... *H05K 5/0017* (2013.01)

(58) Field of Classification Search
CPC ... H01R 13/717–13/7177; G02B 6/0001; H05K 5/0017
USPC ................ 340/644, 815.45–815.57
See application file for complete search history.

(56) References Cited

U.S. PATENT DOCUMENTS

| 3,786,499 A | * | 1/1974 | Jankowski | .............. H01L 33/00 340/815.45 |
| 4,138,672 A | * | 2/1979 | Kepchar | ................... G09F 9/33 340/815.45 |
| 2009/0269071 A1 | | 10/2009 | Kawamata et al. | |
| 2012/0247935 A1 | * | 10/2012 | Goyal | .................... H01H 13/83 200/5 A |
| 2014/0009723 A1 | | 1/2014 | Cho et al. | |

FOREIGN PATENT DOCUMENTS

| JP | 03-252017 | 11/1991 |
| JP | 07-059181 | 3/1995 |
| JP | 08-237774 | 9/1996 |
| JP | 2000-036990 | 2/2000 |
| JP | 2000-213966 A | 8/2000 |

(Continued)

OTHER PUBLICATIONS

Korean Office Action dated Jan. 13, 2016 issued in corresponding Korean Patent Application No. 10-2015-0032551 and English summary thereof.

(Continued)

*Primary Examiner* — Thomas Mullen
(74) *Attorney, Agent, or Firm* — Greenblum & Bernstein, P.L.C.

(57) ABSTRACT

A terminal device includes a device housing and a printed wiring board, accommodated within the device housing, having a display element mounted thereon. The device housing includes an opening formed at a position corresponding to the display element, a partition wall provided between the opening and the printed wiring board. The partition wall is formed into a tubular shape with the opposite ends thereof opened, and the partition wall has one open end which faces the opening and the other open end which faces the display element.

1 Claim, 4 Drawing Sheets

(56) References Cited

FOREIGN PATENT DOCUMENTS

| JP | 2001-086577 | 3/2001 |
|---|---|---|
| JP | 2003-167537 | 6/2003 |
| KR | 10-2009-0112601 A | 10/2009 |
| KR | 10-2014-0004882 | 1/2014 |
| TW | 200814119 A | 3/2008 |
| TW | M404454 U1 | 5/2011 |

OTHER PUBLICATIONS

Taiwanese Office Action dated Jan. 12, 2016, including search report, issued in corresponding Taiwanese Patent Application No. 104107363 and English translation thereof.
Korean Office Action dated Jul. 25, 2016 issued in corresponding Korean Patent Application No. 10-2015-0032551 and English summary thereof.
Chinese Office Action dated Aug. 3, 2016 issued in corresponding Chinese Patent Application No. 201510103387.8 and English translation thereof.
Taiwanese Office Action dated Jul. 28, 2016 issued in corresponding Taiwanese Patent Application No. 104107363 and English translation thereof.

* cited by examiner

TERMINAL DEVICE

CROSS-REFERENCE TO RELATED APPLICATION

This application claims priority to Japanese Patent Application No. 2014-047997 filed on Mar. 11, 2014, the entire contents of which are incorporated herein by reference.

TECHNICAL FIELD

The present disclosure relates to a terminal device.

BACKGROUND ART

Conventionally, there is provided a remote monitoring control system in which a transmission processing device, an operation terminal device and a control terminal device are connected by two signal lines (see, e.g., Japanese Unexamined Patent Application Publication No. 2001-86577). In the remote monitoring control system, specific addresses are respectively allotted to the operation terminal device and the control terminal device.

The operation terminal device includes a plurality of switches. As the states of the switches are changed, e.g., by pressing the switches, the operation terminal device transmits the information as operation data to the transmission processing device.

The transmission processing device gains access to each of the operation terminal device and the control terminal device and receives operation data from the operation terminal device. Furthermore, the transmission processing device transmits control data to the control terminal device which is previously associated, by an address, with the operation terminal device that has generated the operation data.

The control terminal device includes relays provided therein. Upon receiving the control data from the transmission processing device, the control terminal device turns on or off the relays, thereby controlling loads, such as a lighting device and a surveillance camera.

Each of the operation terminal device and the control terminal device includes, e.g., a transceiver circuit unit for transmitting and receiving a transmission signal or the like, a terminal processing unit for monitoring the operation states of the switches and executing control of the relays, and a synthetic-resin-made device housing. The terminal processing unit, the transceiver circuit unit and display elements are realized by, e.g., mounting an integrated circuit on a printed wiring board.

Switches, light emitting diodes (LEDs) as display elements, and so forth are mounted on the printed wiring board of the operation terminal device. As the display elements, there are provided two kinds of display elements, namely a red LED which indicates the turn-on of each of the switches and a green LED which indicates the turn-off of each of the switches. If the switches are pressed, the display elements are turned on or off in a corresponding relationship with the control states of the loads connected to the control terminal device. The switches and the loads are associated with each other by the transmission processing device.

Discrete parts are used as the two kinds of the display elements. The display elements are soldered to the printed wiring board.

The device housing includes a body, a lid, a decoration cover, and a nameplate. The nameplate is ultrasonically bonded to the front surface of the decoration cover. The decoration cover is attached to the outside of the lid. The tip portions of the two kinds of display elements are inserted into insertion holes formed in a bottom wall of the lid of the device housing.

In the operation terminal device of the remote monitoring control system disclosed in Japanese Unexamined Patent Application Publication No. 2001-86577, the discrete-type display elements are mounted on the printed wiring board. The lead portions of the display elements are mounted by manual soldering. Thus, the work efficiency is poor. In the operation terminal device disclosed in Japanese Unexamined Patent Application Publication No. 2001-86577, it is thinkable to change the discrete-type display elements to surface-mount-type display elements. However, the surface-mount-type display elements are less distant from a mounting surface than the discrete-type display elements. That is to say, the distance from the light emission surfaces of the display elements to the front surface of the device housing becomes longer. This makes it difficult to enhance the visibility of the display elements.

SUMMARY OF THE INVENTION

In view of the above, the present disclosure provides a terminal device capable of enhancing the workability and the visibility of a display element.

In accordance with a first aspect of the present invention, there is provided a terminal device including: a device housing; and a printed wiring board, accommodated within the device housing, having a display element mounted thereon, wherein the device housing includes an opening formed at a position corresponding to the display element, and a partition wall provided between the opening and the printed wiring board, the partition wall is formed into a tubular shape with the opposite ends thereof opened, and the partition wall has one open end which faces the opening and the other open end which faces the display element.

The terminal device may further includes a protection cover which closes the opening at the outside of the device housing and which allows light emitted from the display element to pass therethrough, wherein the protection cover includes a base made of a light-transmitting material, a print layer provided on one surface of the base, a diffusion layer provided on the other surface of the base opposite to the one surface, and a light-transmitting protection layer arranged to cover the print layer, and wherein the protection cover is attached to the device housing via the diffusion layer.

In accordance with a second aspect of the present invention, there is provided a remote monitoring control system including: a transmission processing device; an operation terminal device connected to the transmission processing device through a signal line; and a plurality of control terminal devices having different addresses and connected to the transmission processing device through the signal line, wherein the operation terminal device includes: a device housing; and a printed wiring board accommodated within the device housing and having a display element mounted thereon, wherein the device housing includes an opening formed at a position corresponding to the display element, and a partition wall provided between the opening and the printed wiring board, the partition wall is formed into a tubular shape with the opposite ends thereof opened, and the partition wall has one open end which faces the opening and the other open end which faces the display element, and wherein operation data generated by an operation of the operation terminal device is transmitted to the transmission processing device, the transmission processing device transmits control data generated based on the operation data, to one of the plurality of control terminal devices to thereby control a load connected the one control terminal device, and the operation terminal device controls the display element corresponding to the load, based on the state of the load The terminal device of the present disclosure makes use of a surface-mount-type display element. This provides an effect of enhancing the work efficiency. In the terminal device of the present disclosure, a tubular partition wall surrounding the display element is provided between the printed wiring board and the lid. Thus, the light emitted from the display element is reflected within the partition wall and is irradiated to the outside through an opening of a device housing. Accordingly, the terminal device of the present disclosure provides an effect of enhancing the visibility despite the use of the surface-mount-type display element.

BRIEF DESCRIPTION OF THE DRAWINGS

The figures depict one or more implementations in accordance with the present teaching, by way of example only, not by way of limitations. In the figures, like reference numerals refer to the same or similar elements.

DETAILED DESCRIPTION

An embodiment in which the technical concept of the present invention is applied to an operation terminal device of a remote monitoring control system disclosed in Japanese Unexamined Patent Application Publication No. 2001-86577 will now be described in detail. However, a terminal device to which the technical concept of the present invention can be applied is not limited to the operation terminal device of the present embodiment.

Figure 7:
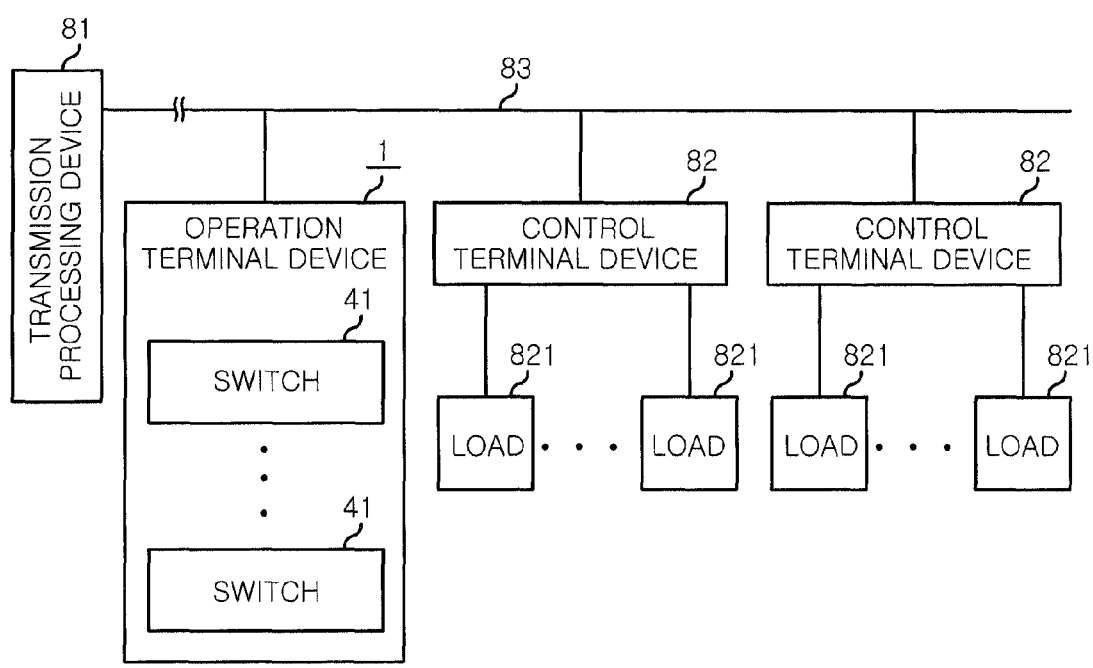
FIG. 7 is a schematic configuration view of a remote monitoring control system which employs the terminal device according to the embodiment of the present invention.

First, a remote monitoring control system which employs the operation terminal device according to the present embodiment will be briefly described with reference to FIG. 7.

The remote monitoring control system includes a transmission processing device 81, an operation terminal device 1, and control terminal devices 82. The operation terminal device 1 for monitoring the operation states of switches 41 and the control terminal devices 82 for controlling loads 821 are connected to the transmission processing device 81 through two-wire-type signal lines 83. The operation terminal device 1 and the control terminal devices 82 are respectively allotted with specific addresses. Using these addresses, the transmission processing device 81 individually recognizes the operation terminal device 1 and the control terminal devices 82.

The transmission processing device 81 executes transmission and reception of data between the operation terminal device 1 and the control terminal devices 82 using time division multiplex transmission signals. The operation terminal device 1 includes switches 41 composed of a plurality of tact switches as described later, and multiple sets of surface-mount-type display elements 421 and 422 corresponding to the respective switches 41. If one of the switches 41 is operated, the operation terminal device 1 transmits operation data to the transmission processing device 81 using the transmission signals.

Upon receiving the operation data from the operation terminal device 1, the transmission processing device 81 searches and acquires the address of the operation terminal device 1. The transmission processing device 81 stores the correspondence relationship of the address of the operation terminal device 1 and the identification numbers of the switches 41 with the addresses of the control terminal devices 82 and the identification numbers of loads 821.

Upon acquiring the address of the operation terminal device 1, the transmission processing device 81 transmits control data to the control terminal device 82 to which the load 821 corresponding to the identification number of the operated switch 41 is connected. Upon receiving the control data, the control terminal device 82 controls the load 821 having the identification number designated by the control data.

The control terminal device 82 transmits the state of the load 821 having the identification number designated by the control data to the transmission processing device 81. The transmission processing device 81 transmits the state of the load 821 to the operation terminal device 1 which is a transmission source of the operation data. The operation terminal device 1 controls the states of (turns on or off) the display elements 421 and 422 corresponding to the operated switch 41.

Figure 2:
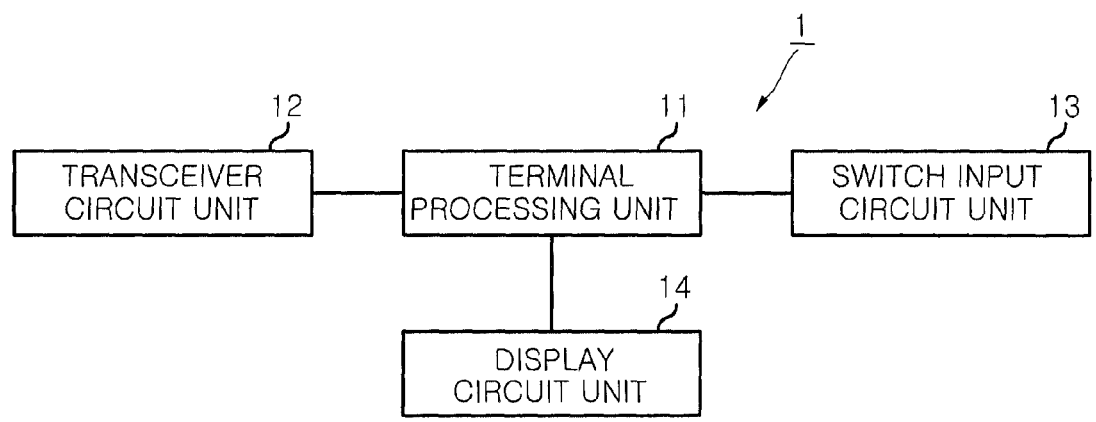
FIG. 2 is a block diagram showing an internal circuit of the terminal device according to the embodiment of the present invention.

Next, the circuit configuration of the operation terminal device 1 will be described with reference to FIG. 2.

The operation terminal device 1 includes a terminal processing unit 11, a transceiver circuit unit 12, a switch input circuit unit 13, a display circuit unit 14, and so forth. The transceiver circuit unit 12 is connected to the signal lines 83 through terminals 2 and is configured to transmit and receive the operation data and the control data. The switch input circuit unit 13 includes the switches 41 and transmits the operation state of the operated switch 41 to the terminal processing unit 11 when one of the switches 41 is operated. The terminal processing unit 11 includes a dedicated integrated circuit having a microprocessor therein. Upon receiving the operation state of the operated switch 41 from the switch input circuit unit 13, the terminal processing unit 11 transmits a transmission signal from the transceiver circuit unit 12 to the transmission processing device 81 through the signal lines 83, thereby notifying the operation state of the operated switch 41 to the transmission processing device 81. The display circuit unit 14 includes the display elements 421 and 422. The terminal processing unit 11 receives the control state of the load 821 having the identification number corresponding to the operated switch 41 from the transceiver circuit unit 12 through the signal lines 83. The terminal processing unit 11 transmits the turn-on or turn-off of the display elements 421 and 422 corresponding to the operated switch 41 to the display circuit unit 14.

The display element 421 is composed of a red LED and is turned on when the load 821 is operated. The display element 422 is composed of a green LED and is turned on when the load 821 is not operated. The display elements 421 and 422 correspond to each of the switches 41. Each of the switches 41 is associated with one set of display elements 421 and 422.

Figure 1:
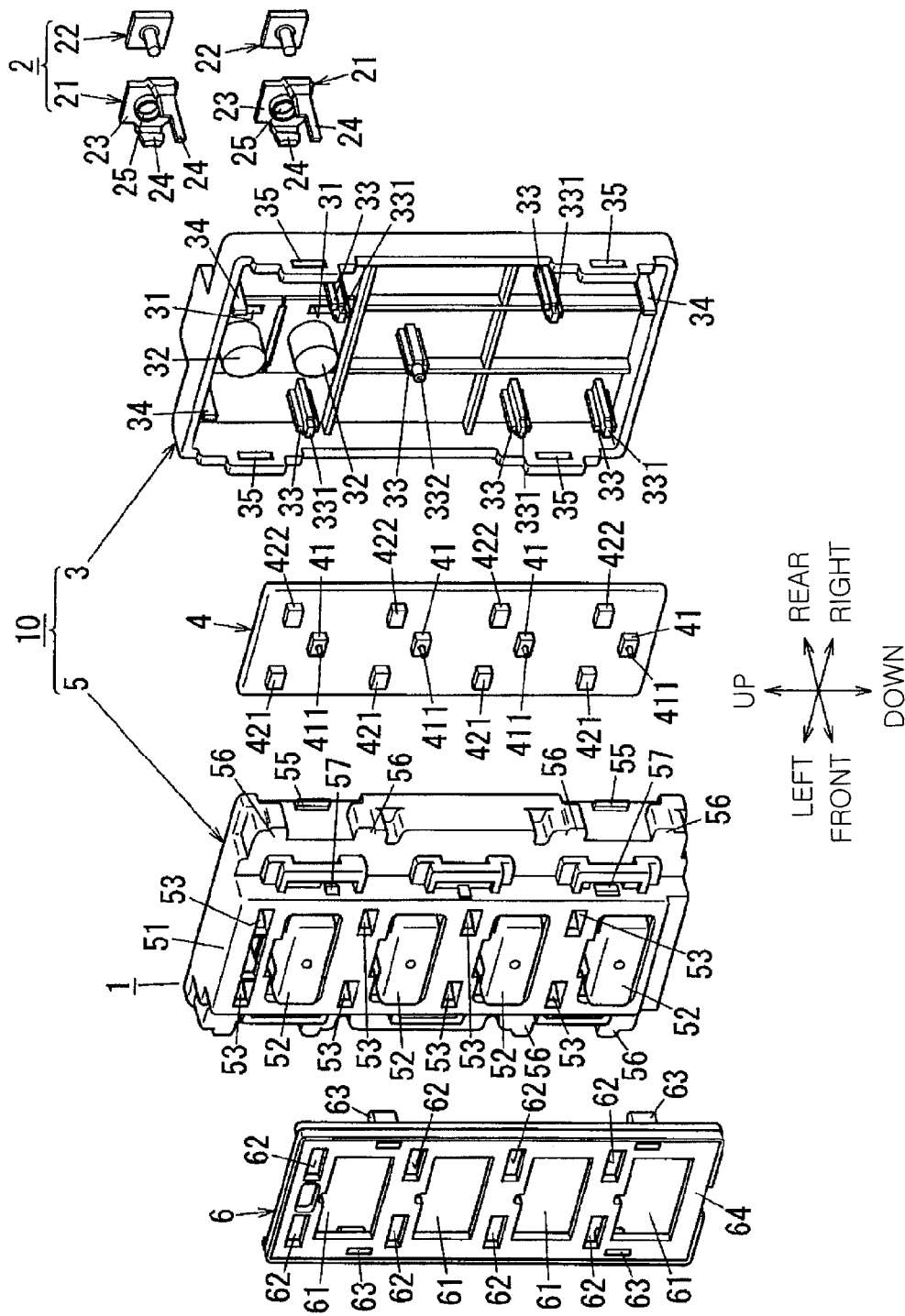
FIG. 1 is an exploded perspective view showing a terminal device according to an embodiment of the present invention.
Figure 5:
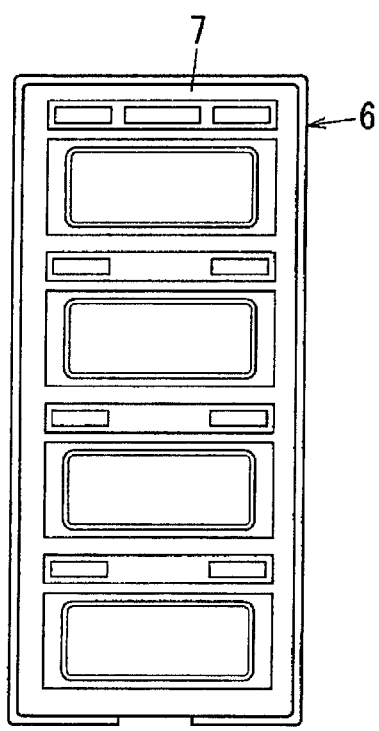
FIG. 5 is a front view of a decoration cover and a protection cover of the terminal device according to the embodiment of the present invention.

Next, the structure of the operation terminal device 1 will be described with reference to FIG. 1. In the following description, an up-down direction, a left-right direction and a front-rear direction will be defined on the basis of FIG. 1. The structure of a protection cover 7 will be described with reference to FIGS. 5 and 6.

The operation terminal device 1 includes terminals 2, a device housing 10, a printed wiring board 4, a decoration cover 6 and a protection cover 7.

Each of the terminals 2 includes a terminal plate 21 and a terminal screw 22. The terminal plate 21 is made of a metallic material. The terminal plate 21 includes a main portion 23 and leg portions 24, which are integrally formed with each other. The main portion 23 is formed into a substantially rectangular shape and is provided with a screw hole 25 at the center thereof. The leg portions 24 extend from the left and right sides of the main portion 23 in a perpendicular relationship with the surface of the main portion 23 attached to a body 3 which will be described later. The terminal screw 22 is threadedly coupled to the screw hole 25 to form the terminal 2. The terminals 2 are connected to the printed wiring board 4, the transmission processing device 81 and the control terminals 82 via the signal lines 83.

The device housing 10 includes a body 3 and a lid 5.

The body 3 is made of a synthetic resin and is formed into a substantially box-like shape with a front surface thereof opened. Two terminal attachment parts, each of which includes a pair of attachment holes 31 and a depressed portion 32, are provided in the bottom wall of the body 3. That is to say, two terminals 2 to which the signal lines 83 are connected are attached to the rear surface of the bottom wall of the body 3. Each of the attachment holes 31 is formed into a vertically-elongated rectangular shape. The depressed portion 32 having a cylindrical shape is provided between the attachment holes 31. The depressed portion 32 protrudes forward from the bottom wall of the body 3. The depressed portion 32 is formed into a closed-bottom cylindrical shape so as to protrude forward from the bottom wall of the body 3.

Six ribs 33 are provided on the front surface of the bottom wall of the body 3. Each of five ribs 33 except the rib 33 positioned at or around the center of the body 3 includes a stepped portion 331 formed at the tip thereof. The printed wiring board 4 is fitted to the stepped portions 331 of the ribs 33 and is therefore position-decided in the left-right direction. Furthermore, the printed wiring board 4 is position-decided in the up-down direction by virtue of stopper plates 34 provided in the body 3. Moreover, the printed wiring board 4 is fixed by a screw threaded into a screw hole 332 formed in the rib 33 positioned at or around the center of the body 3.

The printed wiring board 4 is formed into a rectangular shape. Four switches 41 and four sets of display elements 421 and 422 are mounted on the printed wiring board 4. The display elements 421 and 422 are mounted in pair at the upper left side and the upper right side of each of the switches 41. The terminal processing unit 11, the transceiver circuit unit 12 and the like are mounted on the rear surface of the printed wiring board 4.

The lid 5 is made of a synthetic resin and is formed into a substantially box-like shape with the rear surface thereof opened. A protrusion portion 51 is provided on the front surface of the bottom wall of the lid 5 so as to protrude forward. Handles 52 having a substantially rectangular shape are integrally formed with the front wall of the protrusion portion 51. The handles 52 are disposed to correspond to the respective push buttons 411 of the switches 41 in a state that the device housing 10 carrying the printed wiring board 4 is assembled. Thus, if the handles 52 are pushed, the push buttons 411 of the switches 41 are pressed and operated.

The lid 5 includes multiple pairs of openings 53 each pair of which is disposed above each handle 52 formed in the front wall of the protrusion portion 51. The openings 53 are disposed to correspond to the display elements 421 and 422 in a state that the device housing 10 carrying the printed wiring board 4 is assembled.

The lid 5 includes assembling claws 55 provided at four points in the opposite edges of the lid 5. The body 3 includes four assembling holes 35 formed on the left and right side surfaces of the body 3 in a corresponding relationship with the assembling claws 55. As the assembling claws 55 and the assembling holes 35 are fitted and coupled to each other, the body 3 and the lid 5 make up the device housing 10.

The lid 5 includes two pairs of locking claws 56 provided on each of the left side surface and right side surface thereof. The lid 5 is detachably attached to an attachment frame (not shown) by the locking claws 56. The attachment frame is well-known in the related art and is configured such that an embedment-type wiring instrument is embedded and disposed in the attachment frame.

The decoration cover 6 is made of a synthetic resin and is formed into a substantially rectangular plate shape. Four openings 61, into which four handles 52 are respectively inserted, are formed in the decoration cover 6 and are arranged side by side in the up-down direction. The decoration cover 6 includes through-holes 62 formed at positions corresponding to the openings 53 of the lid 5. The through-holes 62 are formed at the positions where the through-holes 62 overlap with the openings 53 when the decoration cover 6 is attached to the lid 5 (see FIG. 3).

The decoration cover 6 includes engaging pieces 63 perpendicularly protruding from four points of the rear surface of the decoration cover 6. The engaging pieces 63 engage with projection portions 57 provided on the side surfaces of the protrusion portion 51 of the lid 5. Thus, the decoration cover 6 is detachably attached to the front surface of the protrusion portion 51 protruding forward from the bottom wall of the lid 5.

The protection cover 7 is attached to an recess portion 64 formed on the front surface of the decoration cover 6. Name cards (not shown) are attached to the front surfaces of the handles 52 and are interposed between the protection cover 7 and the handles 52.

Figure 6:
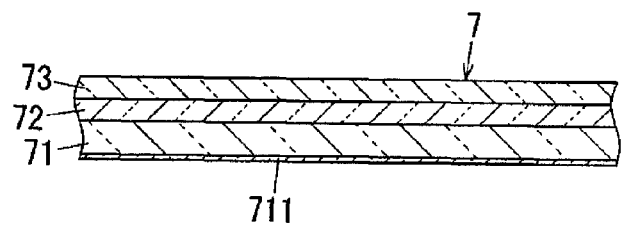
FIG. 6 is a partially cutaway sectional view of the protection cover employed in the terminal device according to the embodiment of the present invention.

As shown in FIG. 6, the protection cover 7 includes a base 71 formed into a substantially rectangular shape by a light-transmitting material such as a polycarbonate film or the like, a print layer 72 and a protection layer 73. The print layer 72 is provided on one surface of the base 71. A diffusion layer 711 to be subjected to matt processing is provided on the other surface of the base 71. A multiplicity of irregularities is formed on the diffusion layer 711 by matt processing. Thus, the diffusion layer 711 diffuses the light emitted from the display elements 421 and 422. The protection layer 73 allows light to pass therethrough and protects the print layer 72.

The protection cover 7 is attached to the decoration cover 6 by ultrasonically bonding the diffusion layer 711 to the decoration cover 6.

Finally, the structure of the lid 5 which is a feature of the present invention will be described with reference to FIG. 3. The protection cover 7 will also be described with reference to FIG. 6.

Figure 4:
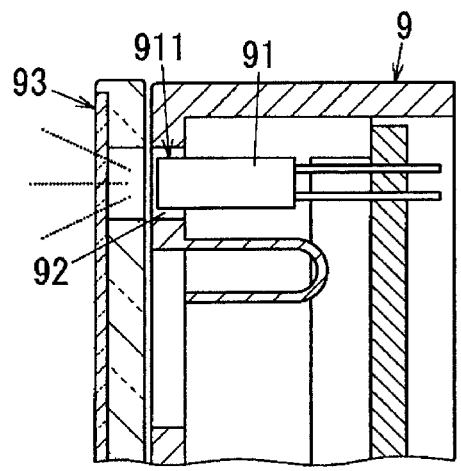
FIG. 4 is a sectional view of major portions of a conventional terminal device.

In a display element 91 (of the conventional operation terminal device) disclosed in Japanese Unexamined Patent Application Publication No. 2001-86577, as shown in FIG. 4, a discrete-type LED is used. No space exists between an opening 92 of a lid 9 and the display element 91. A tip 911 of a lens portion of the display element 91 is inserted into the opening 92 of the lid 9. Thus, the light emitted from the display element 91 is easily visible from the outside even when the lid 9 is covered with a protection cover 93.

Figure 3:
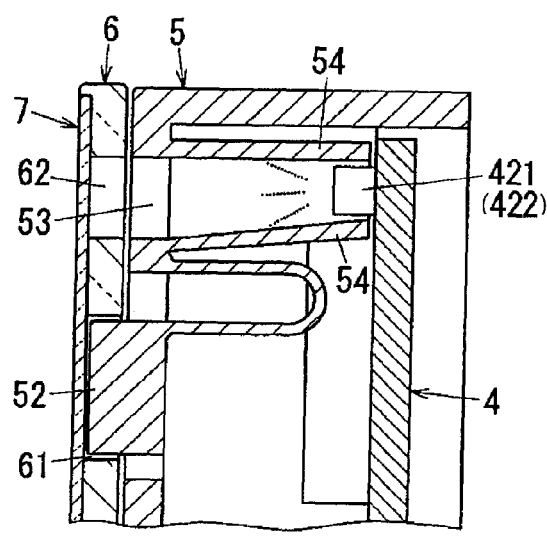
FIG. 3 is a sectional view of major portions of the terminal device according to the embodiment of the present invention.

On the other hand, in the display element 421 or 422 according to the present embodiment, as shown in FIG. 3, a surface-mount-type display element is used. For that reason, a space having a specified distance exists between the opening 53 and the display element 421 or 422. In this state, the light emitted from the display element 421 or 422 is diffused between the lid 5 and the printed wiring board 4. This makes it difficult to enhance the visibility from the outside of the lid 5.

In the present embodiment, for the purpose of enhancing the visibility, the lid 5 includes a tubular partition wall 54 which surrounds each of the display elements 421 and 422. The partition wall 54 extends backward from the periphery of the opening 53 and has such a length that the tip of the partition wall 54 is positioned close to the printed wiring board 4. An inner surface of the partition wall 54 is formed of a reflective material. The light emitted from each of the display elements 421 and 422 is reflected by the inner surface of the partition wall 54 and is irradiated toward the front side of the lid 5 through the opening 53 and the through-hole 62 of the decoration cover 6. As a result, it becomes easy to enhance the visibility from the front side of the device housing 10.

The diffusion layer 711 of the protection cover 7 diffuses the light emitted from the display elements 421 and 422. The light diffused in the diffusion layer 711 is irradiated forward through the light-transmitting protection layer 73. This makes it possible to enhance the visibility from the outside of the operation terminal device 1. In addition, the protection cover 7 covers the clearances existing around the respective handles 52 and the through-hole 62, thereby preventing foreign materials from entering the device housing 10.

The terminal device (the operation terminal device 1) of the present embodiment is used in a remote monitoring control system. In this system, a plurality of terminal devices (operation terminal devices 1) having different addresses are connected to the transmission processing device 81 through the signal lines 83. Operation data generated by operating one of the switches 41 are transmitted from the terminal device (the operation terminal device 1) to the transmission processing device 81. The transmission processing device 81 transmits control data, which are generated based on the operation data, to another terminal device (the control terminal device 82), thereby controlling the loads 821 connected to the another terminal device (the control terminal device 82). The terminal device (the operation terminal device 1) which has transmitted the operation data controls the display elements 421 and 422 corresponding to the operated switch 41, based on the states of the loads 821. The terminal device (the operation terminal device 1) includes the device housing 10, and the printed wiring board 4 accommodated within the device housing 10. The switches 41 and the display elements 421 and 422 are mounted on the printed wiring board 4. The openings 53 are formed in the device housing 10 at positions corresponding to the display elements 421 and 422. The device housing 10 includes the partition walls 54 provided between the openings 53 and the printed wiring board 4. Each of the partition walls 54 is formed into a tubular shape with the opposite ends thereof opened. Each of the partition walls 54 has one open end which faces the corresponding opening 53 and the other open end which faces the corresponding display element 421 or 422.

By employing the surface-mount-type display elements 421 and 422, the operation terminal device 1 of the present embodiment can enhance the work efficiency. Moreover, the light emitted from the display elements 421 and 422 passes through the inside of the partition walls 54 provided in the lid 5 and is guided to the openings 53. This makes it possible to enhance the visibility.

The terminal device (the operation terminal device 1) of the present embodiment preferably further includes the protection cover 7 which closes the openings 53 at the outside of the device housing 10 and which allows the light of the display elements 421 and 422 to pass therethrough. The protection cover 7 preferably includes the base 71 made of a light-transmitting material, the print layer 72 provided on one surface of the base 71, and the light-transmitting protection layer 73 arranged to cover the print layer 72. The base 71 preferably includes the diffusion layer 711 provided on the opposite surface of the base 71 from the print layer 72 so as to diffuse the light. The protection cover 7 is preferably attached to the device housing 10 at the side of the diffusion layer 711.

According to the operation terminal device 1 of the present embodiment, the light emitted from the display elements 421 and 422 can be diffused by the diffusion layer 711 of the protection cover 7. Then, the light passes through the protection layer 73. This makes it possible to enhance the visibility from the front side of the operation terminal device 1.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A terminal device comprising:
    a device housing including a front wall and a partition wall;
    a printed wiring board, accommodated within the device housing, having a surface-mount-type LED mounted thereon; and
    a protection cover that allows light emitted from the surface-mount-type LED to pass therethrough, the protection cover including:
        a base defined by a light-transmitting material;
        a print layer provided directly on one surface of the base;
        a diffusion layer provided directly on an other surface of the base opposite to the one surface; and a light-transmitting protection layer that covers the print layer, wherein the front wall includes an opening provided at a position corresponding to the surface-mount-type LED such that a space having a specified distance exists between the opening and the surface-mount-type LED, and the partition wall is provided between the opening and the printed wiring board, the partition wall has a tubular shape with opposite ends thereof opened, one open end of the opposite ends of the partition wall faces the opening, the partition wall extends backward from a periphery of the opening toward the surface-mount-type LED, the other open end of the opposite ends of the partition wall surrounds the surface-mount-type LED, and the protection cover closes the opening of the front wall and is attached via the diffusion layer to the device housing.

* * * * *